United States Patent
Hsu et al.

(10) Patent No.: US 8,691,653 B2
(45) Date of Patent: Apr. 8, 2014

(54) SEMICONDUCTOR STRUCTURE WITH REDUCED SURFACE FIELD EFFECT AND MANUFACTURING PROCESS THEREOF

(75) Inventors: Chih-Chia Hsu, Zhongli (TW); Yu-Hsien Chin, Taipei (TW); Yin-Fu Huang, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 103 days.

(21) Appl. No.: 13/411,908

(22) Filed: Mar. 5, 2012

(65) Prior Publication Data
US 2013/0228861 A1    Sep. 5, 2013

(51) Int. Cl.
*H01L 21/336* (2006.01)
*H01L 21/8238* (2006.01)
*H01L 21/76* (2006.01)
*H01L 29/76* (2006.01)

(52) U.S. Cl.
USPC ........... 438/286; 438/217; 438/224; 438/449; 438/451; 438/291; 257/343; 257/341; 257/335

(58) Field of Classification Search
USPC .......... 257/335, 342, 343, E29.066, E29.256, 257/E29.261, E21.373, E21.417, E21.424, 257/E21.427; 438/286
See application file for complete search history.

(56) References Cited

U.S. PATENT DOCUMENTS

| | | | |
|---|---|---|---|
| 6,946,705 B2 * | 9/2005 | Kitaguchi | 257/335 |
| 2006/0220120 A1 * | 10/2006 | Horch | 257/341 |
| 2009/0001461 A1 * | 1/2009 | Ko | 257/343 |

* cited by examiner

*Primary Examiner* — Yasser A Abdelaziez
*Assistant Examiner* — Cory Eskridge
(74) *Attorney, Agent, or Firm* — McClure, Qualey & Rodack, LLP

(57) ABSTRACT

A semiconductor structure and a manufacturing process thereof are disclosed. The semiconductor structure includes a substrate having a first conductive type, a first well having a second conductive type formed in the substrate, a doped region having the second conductive type formed in the first well, a field oxide and a second well having the first conductive type. The doped region has a first net dopant concentration. The field oxide is formed on a surface area of the first well. The second well is disposed underneath the field oxide and connected to a side of the doped region. The second well has a second net dopant concentration smaller than the first net dopant concentration.

9 Claims, 2 Drawing Sheets

SEMICONDUCTOR STRUCTURE WITH REDUCED SURFACE FIELD EFFECT AND MANUFACTURING PROCESS THEREOF

BACKGROUND OF THE INVENTION

1. Field of the Invention

The invention relates in general to a semiconductor structure and a manufacturing process thereof, and more particularly to a metal oxide semiconductor (MOS) structure and a manufacturing process thereof.

2. Description of the Related Art

In the high voltage system, it is important for a metal oxide semiconductor (MOS) device having a high off-state breakdown voltage (off-Vbd) and a low on-state resistance (Ronsp), so that the MOS device can be operated under high voltage to allow a high current flowing between the drain and the source. Thus, the power consumption of the MOS device will be lowered. However, high off-state breakdown voltage and high on-state resistance generally come together, when the off-state breakdown voltage increases, the on-state resistance comparatively increases. Therefore, it does not tend to design a MOS device having an off-state breakdown voltage toward to maximum. It is an urgent problem to be resolved for industries to design MOS device having a high off-state breakdown voltage and a low on-state resistance.

SUMMARY OF THE INVENTION

The invention is directed to a semiconductor structure and a manufacturing process thereof, the dopant concentration adjacent to the drain terminal is lowered by implanting dopants having inverse conductivity, so that a depletion region is easier to form between the drain terminal and the body of the source terminal, resulting in a higher off-state breakdown voltage and a lower on-state resistance.

According to a first aspect of the present invention, a semiconductor structure is disclosed. The semiconductor structure includes a substrate having a first conductive type, a first well having a second conductive type formed in the substrate, a doped region having the second conductive type formed in the first well, a field oxide and a second well having the first conductive type. The doped region has a first net dopant concentration. The field oxide is formed on a surface area of the first well. The second well is disposed underneath the field oxide and connected to a side of the doped region. The second well has a second net dopant concentration smaller than the first net dopant concentration.

According to a second aspect of the present invention, a manufacturing process of a semiconductor structure is disclosed. A substrate having a first conductive type is provided. A first well having a second conductive type is formed in the substrate. A doped region having the second conductive type is formed in the first well, and the doped region has a first net dopant concentration. a second well having the second conductive type is formed in the doped region. The second well is connected to a side of the doped region, wherein the second well has a second net dopant concentration smaller than the first net dopant concentration. A field oxide is formed on top of the second well.

The above and other aspects of the invention will become better understood with regard to the following detailed description of the preferred but non-limiting embodiment(s). The following description is made with reference to the accompanying drawings.

DETAILED DESCRIPTION OF THE INVENTION

In the semiconductor structure and the manufacturing process of the present invention, the dopant concentration adjacent to the drain terminal is lowered by implanting dopants having inverse conductivity, and thus a drain doped region having stair-stepping dopant concentration is obtained, so that a depletion region is easier to form between the drain terminal and the body of the source terminal. According to the reduced surface field (RESURF) effect, the depletion region, formed in the periphery of the drain terminal at the same distance condition, can result in a higher off-state breakdown voltage and a lower on-state resistance. The nearer approaching to the drain terminal is, the higher dopant concentration is, so that the kirk effect is prevented and thus the high breakdown voltage can be held in the operation.

A number of embodiments are disclosed below for detailed descriptions of the invention only, not for limiting the scope of protection of the invention.

Figure 1:
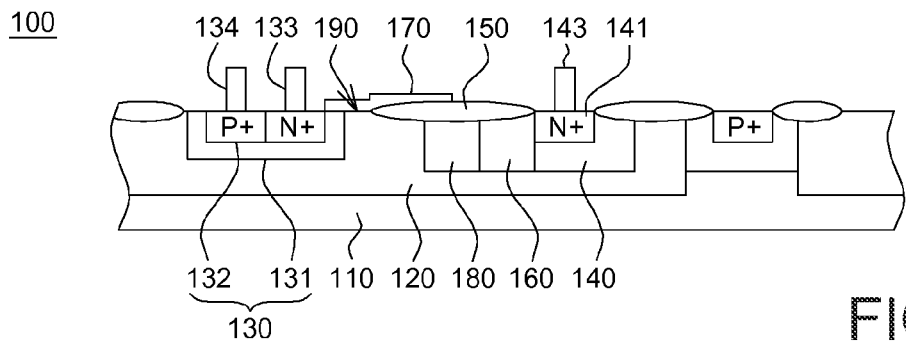
FIG. 1 is a schematic view illustrating a semiconductor structure according to an embodiment of the present invention.

FIG. 1 is a schematic view illustrating a semiconductor structure according to an embodiment of the present invention. The semiconductor structure, such as a double diffusion metal semiconductor structure, includes a substrate 110, a first well 120, a source doped region 130, a drain doped region 140, a field oxide 150 and a second well 160 underneath the field oxide 150. The substrate 110, for example, is a p-type substrate 110, and the first well 120, for example, is an n-type well formed in the substrate 110. The source doped region 130 and the drain doped region 140 are disposed in the first well 120. The source doped region 130 includes a body 131 and a heavy doped region 132. The body 131 is a p-type body, and the heavy doped region 132 is such as an N+ doped region and a P+ doped region, which can be used as the contact regions for the source terminal 133 and the bulk terminal 134, respectively. The drain doped region 140 has a heavy doped region 141, such as an N+ doped region, which can be used as the contact region for the drain terminal 143. The field oxide 150 is formed on a surface area of the first well 120 and between the source doped region 130 and the drain doped region 140, which is made from such as silicon oxide. The field oxide 150 can be a shallow trench isolating structure to isolate the source doped region 130 from the drain doped region 140.

Moreover, the gate structure 170 is formed on the body, the channel region and a portion of the field oxide 150. In the present embodiment, the voltage applied to the gate structure 170 can be modulated to control the threshold voltage of the semiconductor structure 100 or to turn off the semiconductor structure 100. In addition, when a bias occurs between the voltage applied to the drain doped region 140 and the voltage applied to the source doped region 130, the bias allows a current flowing between the drain doped region 140 and the source doped region 130. For instance, under the operation of high voltage, the drain doped region 140 is connected to a high voltage and the source doped region 130 is grounded.

In the embodiment, the second well 160 under the field oxide 150 is connected to a side of the drain doped region 140. The second well 160 has a second conductive type dopant concentration. For instance, the substrate 110 and the source doped region 130 have first conductive type dopants, such as p-type. The first well 120, the drain doped region 140 and the second well 160 have second conductive type dopants, such as n-type, and the polarity of the second conductive type dopants is inverse to that of the first conductive type dopants. The drain doped region 140 has a first net dopant concentration, and the second well 160 has a second net dopant concentration, which is smaller than the first net dopant concentration. In an embodiment, P type dopants are implanted into a portion of the drain doped region 140 to form a second well 160, so that the net dopant concentration of the second well 160 is smaller than that of the drain doped region 140.

Referring to the FIG. 1, a third well 180 having a second conductive type is formed in the first well 120, and the second well 160 is formed between the third well 180 and the drain doped region 140. The third well 180 has a third net dopant concentration, which is smaller than the second net dopant concentration. For example, P type dopants are implanted into a portion of the first well 120 to form a third well 180, so that the net dopant concentration of the third well 180 is smaller than that of the drain doped region 140. In addition, the first well 120 has a fourth net dopant concentration, which is smaller than that of the drain doped region 140, but is greater than that of the third well 180.

As compared for the dopant concentration, the second conductive type net dopant concentration decreases gradually, for example as a stair, from the drain doped region 140 to the second well 160. When the second conductive type net dopant concentration decreases gradually, a depletion region is easier to form in the periphery of the drain doped region 140. Therefore, the drain doped region 140 can bear higher breakdown voltage accordingly.

Further, referring to the FIGS. 2A-2D, a manufacturing process of a semiconductor structure according to an embodiment of the present invention is shown. In the FIG. 2A, a substrate 110 having a first conductive type is provided, and then a first well 120 having a second conductive type is formed in the substrate 110. A doping process is conducted to form a drain doped region 140 in the first well 120, and the drain doped region 140 has a first net dopant concentration. Next, in the FIGS. 2B and 2C, a doping process of first conductive type (such as p type) is conducted by shielding a portion of the drain doped region 140 with a mask such as a photoresist pattern 101, to form a second well 160 in an edge portion of the drain doped region 140. The second well 160 is connected to a side of the drain doped region 140 and has a second conductive type (such as N type) net dopant concentration, that is, a second net dopant concentration, which is smaller that the first net dopant concentration. The drain doped region 140 having n type dopant is just exemplified in the present embodiment, but the present invention is not limited thereto.

Figure 2A:
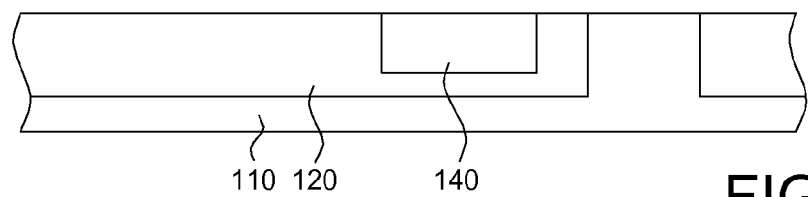
FIGS. 2A-2D show a manufacturing process of a semiconductor structure according to an embodiment of the present invention.
Figure 2B:
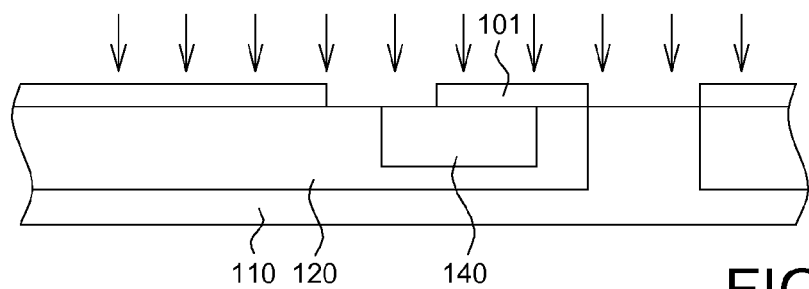
Figure 2C:
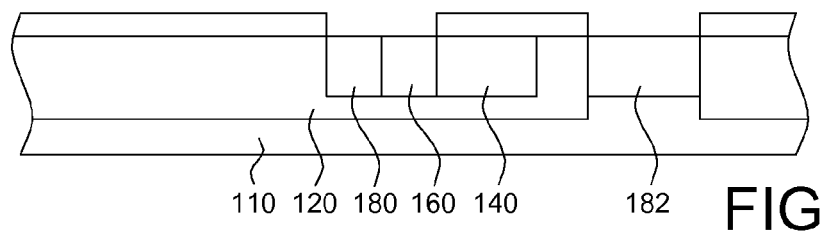
Figure 2D:
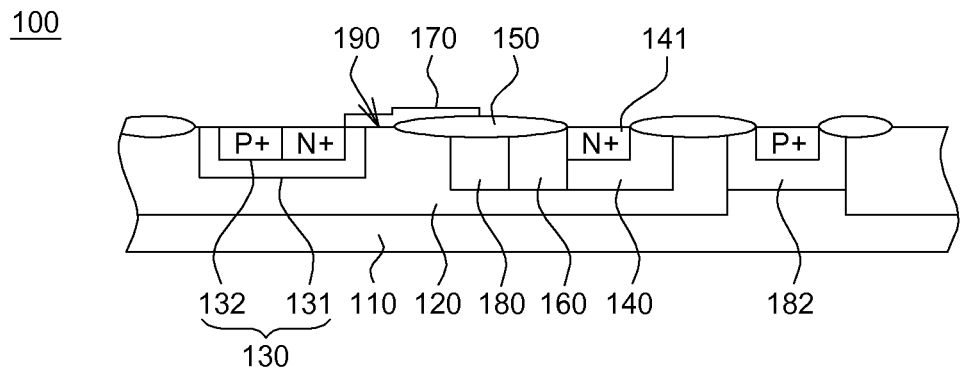

In addition, in the FIG. 2C, the process further includes the step of forming a third well 180 having a second conductive type on a side of the second well when doping p-type dopants into a part of first well 120. The third well 180 has a third net dopant concentration smaller than the second net dopant concentration. In the embodiment, the second well and the third well are formed by the same photomask process, for example.

In an embodiment, the second well 160, the third well 180 and the p type doped region 182 are formed by using the same photo mask process to implant P type dopants, for example. Therefore, the steps of process and the cost of photo mask are not added accordingly.

In the FIG. 2B, since the P type dopants are implanted into the second well 160 and the third well 180, the second conductive type net dopant concentration decreases gradually, a depletion region is easier to form in the periphery of the drain doped region 140. Therefore, the drain doped region 140 can bear higher breakdown voltage accordingly.

Further, referring to FIG. 2C, a thermal oxidation process is conducted to form a field oxide 150 on the surface region of the first well 120, and the second well 160 and the third well 180 are covered under the field oxide 150. The field oxide 150 is used to isolate the source doped region 130 from the drain doped region 140. For example, the field oxide 150 and the drain doped region 140 are connected, and a channel region 190 is formed between the field oxide 150 and the source doped region 130. Moreover, a gate structure 170 can be formed on the body 131 of the source doped region 130, the channel region 190 and a portion of the field oxide 150. When the gate structure 170 is used to turn on the semiconductor structure 100, and a bias is applied between the drain doped region 140 and the source doped region 130, a current is generated between the drain doped region 140 and the source doped region 130 and can flow through the channel region 190. In an embodiment, since the third well 180 has a lower second conductive type dopant concentration and the on-state resistance decreases, a higher drain current is generated accordingly. Therefore, the speed of the operation is enhanced.

Figure 3:
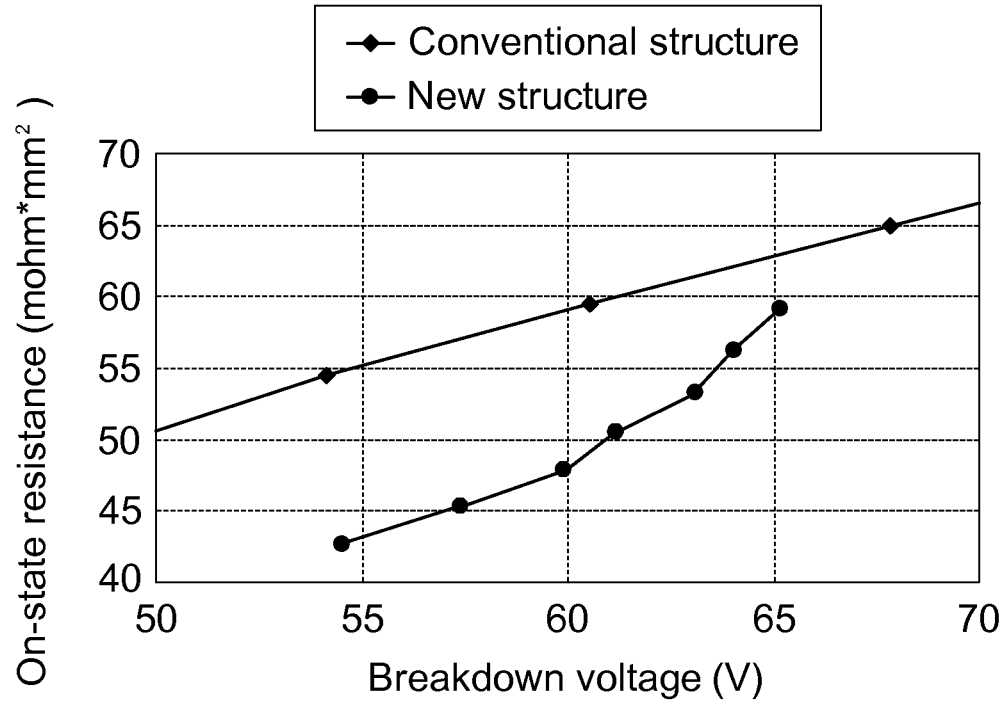
FIG. 3 is a curve diagram of on-state resistance vs breakdown voltage.

Referring to FIG. 3, a curve diagram of on-state resistance vs breakdown voltage is illustrated. In the same breakdown voltage, the new structure of the present invention has lower on-state resistance with respect to the conventional structure. For example, when the breakdown voltage (Vbd) is 60 V, the on-state resistance (Ronsp) in effective area decreases from 58 mohm to 48 mohm, so that the figure of merit (Ronsp/Vbd) can be decrease from 0.97 to 0.8. That is to say, under the condition of smaller size of the semiconductor, the semiconductor still has high breakdown voltage. Therefore, the yield of product is enhanced and the manufacture cost is reduced.

The above-mentioned semiconductor structure 100 can be a metal oxidation semiconductor (MOS) device, such as vertical diffusion MOS, lateral double diffusion MOS (LDMOS) or enhanced diffusion MOS (EDMOS) device etc. However, the present invention is not limited thereto.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing process of a semiconductor structure, the process comprising:
    providing a substrate having a first conductive type;
    forming a first well having a second conductive type in the substrate;
    forming a doped region having the second conductive type in the first well, the doped region has a first net dopant concentration;
    forming a second well having the second conductive type in the doped region, the second well is connected to a side of the doped region, wherein the second well has a second net dopant concentration smaller than the first net dopant concentration; and forming a field oxide on top of the second well, wherein the field oxide has an edge aligned with the side of the doped region without overlapping to each other in a plan view;

wherein the step of forming the second well having the second conductive type comprises implanting dopants having the first conductive type into a part of the doped region, so that the second net dopant concentration is smaller than the first net dopant concentration.

2. The process according to claim 1, further comprising forming a third well having the second conductive type in the first well, the second well is connected between the third well and the doped region, and the third well has a third net dopant concentration smaller than a first dopant concentration.

3. The process according to claim 1, wherein the first well has a fourth net dopant concentration, which is smaller than the first net dopant concentration and greater than the third net dopant concentration.

4. The process according to claim 2, wherein the second conductive type net dopant concentration decreases from the doped region to the third well.

5. The process according to claim 2, wherein the doped region is a drain doped region connected to a side of the field oxide.

6. The process according to claim 1, further comprises forming a gate structure on a portion of the field oxide.

7. The process according to claim 2, wherein the step of forming the third well having the second conductive type comprises implanting dopants having the first conductive type into a part of the first well, so that the third net dopant concentration is smaller than the second net dopant concentration.

8. The process according to claim 2, wherein the second well and the third well are formed by a same photomask process with a single mask and a single implant step.

9. The process according to claim 8, wherein the field oxide is formed by a thermal-expanded silicon oxide or a shallow trench isolating structure.

\* \* \* \* \*